United States Patent
Suzuki et al.

(10) Patent No.: US 6,701,510 B2
(45) Date of Patent: Mar. 2, 2004

(54) COMPUTER READABLE MEDIUM WITH DEFINITION OF INTERFACE RECORDED THEREON, VERIFICATION METHOD FOR FEASIBILITY TO CONNECT GIVEN CIRCUIT AND METHOD OF GENERATING SIGNAL PATTERN

(75) Inventors: Kei Suzuki, Kodaira (JP); Koji Ara, Kokubunji (JP); Kazuo Yano, Hino (JP)

(73) Assignee: Renesas Technology Corporation, Tokyo (JP)

(*) Notice: Subject to any disclaimer, the term of this patent is extended or adjusted under 35 U.S.C. 154(b) by 0 days.

(21) Appl. No.: 10/298,546

(22) Filed: Nov. 19, 2002

(65) Prior Publication Data

US 2003/0070154 A1 Apr. 10, 2003

Related U.S. Application Data

(63) Continuation of application No. 09/420,485, filed on Oct. 19, 1999, now Pat. No. 6,505,338.

(30) Foreign Application Priority Data

Oct. 20, 1998 (JP) .......................................... 10-297827

(51) Int. Cl.[7] .............................................. G06F 17/50
(52) U.S. Cl. .................................. 716/18; 716/4; 716/5
(58) Field of Search ..................................... 716/1–18

(56) References Cited

U.S. PATENT DOCUMENTS

| | | | |
|---|---|---|---|
| 4,622,633 A | 11/1986 | Ceccon et al. | |
| 4,989,203 A | 1/1991 | Phinney | |
| 5,325,534 A | 6/1994 | Galy et al. | |
| 5,499,192 A | 3/1996 | Knapp et al. | |
| 5,598,344 A | 1/1997 | Dangelo et al. | |
| 5,623,417 A | 4/1997 | Iwasaki et al. | |
| 5,798,935 A | 8/1998 | Doreswamy et al. | |
| 6,152,612 A | 11/2000 | Liao et al. | |
| 6,230,114 B1 * | 5/2001 | Hellestrand et al. | 703/13 |
| 6,236,956 B1 | 5/2001 | Mantooth et al. | |
| 6,505,338 B1 * | 1/2003 | Suzuki et al. | 716/18 |

FOREIGN PATENT DOCUMENTS

JP 9-153077 6/1997

OTHER PUBLICATIONS

Suzuki et al., "Owl: An Interface Description Language for IP Reuse," IEEE, May 19, 1999, pp. 403–406.*
Madsen et al., "An Approach to Interface Synthesis," IEEE, 1995, pp. 16–21.*
35th Design Automation Conference, 1998, pp. 8–13.
29th ACM/IEEE Design Automation Conference, 1992, pp. 194–199.
International Conference on Computer Aided Design, 1985, pp. 112–115.
International Conference on Computer Aided Design, 1987, pp. 274–277.

\* cited by examiner

*Primary Examiner*—Vuthe Siek

(57) ABSTRACT

A computer readable medium is arranged to record a circuit description having a description of a function of the circuit module and an interface description provided by distinguishing sets of possible signal values each output terminal may take on plural time points at each pattern and adding an identifier to each of said sets for defining said set and representing said function of said hardware description with the set of said identifiers on a temporal order.

20 Claims, 9 Drawing Sheets

FIG. 2
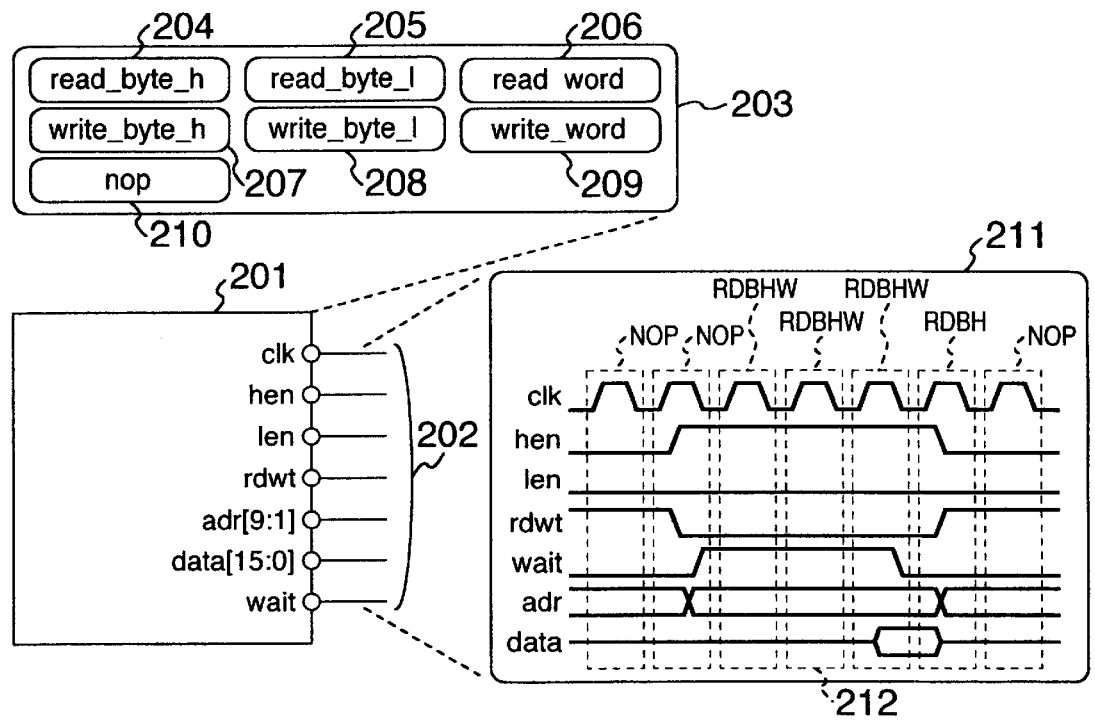
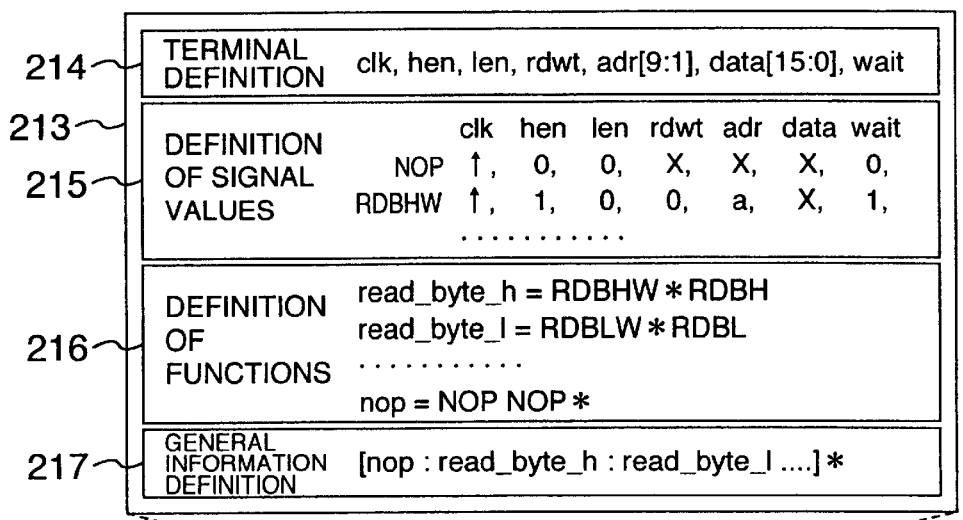

FIG. 3

| INTERFACE NAME | 301 |
|---|---|

| TERMINAL NAME | SIGNAL WIDTH | ATTRIBUTE | |
|---|---|---|---|
| TERMINAL NAME | SIGNAL WIDTH | ATTRIBUTE | 302 |
| TERMINAL NAME | SIGNAL WIDTH | ATTRIBUTE | |
| TERMINAL NAME | SIGNAL WIDTH | ATTRIBUTE | |
| TERMINAL SYMBOL | TERMINAL SYMBOL | TERMINAL SYMBOL | |

| "NAME" | "SHORT" | TERMINAL NAME | TERMINAL NAME | TERMINAL NAME | TERMINAL NAME | |
|---|---|---|---|---|---|---|
| DEFINITION OF SIGNAL VALUE | CLIPPED NAME | LOGICAL VALUE | LOGICAL VALUE | LOGICAL VALUE | LOGICAL VALUE | 303 |
| DEFINITION OF SIGNAL VALUE | CLIPPED NAME | LOGICAL VALUE | LOGICAL VALUE | LOGICAL VALUE | LOGICAL VALUE | |
| DEFINITION OF SIGNAL VALUE | CLIPPED NAME | LOGICAL VALUE | LOGICAL VALUE | LOGICAL VALUE | LOGICAL VALUE | |
| DEFINITION OF SIGNAL VALUE | CLIPPED NAME | LOGICAL VALUE | LOGICAL VALUE | LOGICAL VALUE | LOGICAL VALUE | |
| TERMINAL SYMBOL | TERMINAL SYMBOL | TERMINAL SYMBOL | TERMINAL SYMBOL | TERMINAL SYMBOL | TERMINAL SYMBOL | |

| FUNCTION DEFINITION | SIGNAL, SIGNAL NAME | SIGNAL, SIGNAL NAME | SIGNAL, SIGNAL NAME | TERMINAL SYMBOL | | |
|---|---|---|---|---|---|---|
| FUNCTION DEFINITION | SIGNAL, SIGNAL NAME | SIGNAL, SIGNAL NAME | SIGNAL, SIGNAL NAME | SIGNAL, SIGNAL NAME | TERMINAL SYMBOL | 304 |
| FUNCTION DEFINITION | SIGNAL, SIGNAL NAME | SIGNAL, SIGNAL NAME | TERMINAL SYMBOL | | | |
| FUNCTION DEFINITION | SIGNAL, SIGNAL NAME | SIGNAL, SIGNAL NAME | SIGNAL, SIGNAL NAME | TERMINAL SYMBOL | | |
| TERMINAL SYMBOL | | | | | | |

| FUNCTION, SYMBOL NAME | FUNCTION, SYMBOL NAME | FUNCTION, SYMBOL NAME | FUNCTION, SYMBOL NAME | FUNCTION, SYMBOL NAME | TERMINAL SYMBOL | 305 |
|---|---|---|---|---|---|---|

COMPUTER READABLE MEDIUM WITH DEFINITION OF INTERFACE RECORDED THEREON, VERIFICATION METHOD FOR FEASIBILITY TO CONNECT GIVEN CIRCUIT AND METHOD OF GENERATING SIGNAL PATTERN

This is a continuation application of U.S. Ser. No. 09/420,485, is now a U.S. Pat. No. 6,505,338, filed Oct. 19, 1999.

BACKGROUND OF THE INVENTION

The present invention relates to a technology of correctly defining a specification of an interface of a circuit module and facilitating connection between circuit modules with the defined specification in an integrated circuit system or a digital system having plural circuit modules connected therewith.

Improvement of integration level of an LSI results in implementing a system LSI in which almost of the system is mounted on a chip. In designing such a large-scale system LSI, by combining ready-made circuit modules with one another, it is possible to reduce the designing cost and the man-month for design work. One of the most significant subjects in this type of designing method is how to reuse those ready-made circuit modules. Many proposals have been made to this subject and some of them have been already realized. For example, by describing the read-made logic circuit in a hardware description language to be logically synthesized, the resulting circuit module does not depend on an LSI manufacturing process. Further, the trial for making the interface standards for connection circuit modules is made by the standardizing association called VSIA (Virtual Socket Interface Alliance).

In the meantime, a trial for facilitating connection of read-made logical circuits, that is, automatically synthesizing a connection circuit between the logical circuits has been described in Roberto Passerone et al. "Automatic Synthesis of Interfaces between Incompatible Protocols", pages 8 to 13, at the 35th Design Automation Conference or Andrew Seawright et al. "Synthesis from Production-Based Specifications", pages 194 to 199, at the 29th Design Automation Conference.

These proposals have described the method of describing an interface operation of a logical circuit in a special language and automatically synthesizing a connection circuit from the description. The trial for describing the interface itself has been proposed in J. A. Nestor et al. "Behavioral Synthesis with Interfaces", pages 112 to 115, at the International Conference on Computer Aided Design in 1986 or Gaetano Borriello et al. "Synthesis and Optimization of Interface Transducer Logic", pages 274 to 277, at the International Conference on Computer Aided Design in 1987.

SUMMARY OF THE INVENTION

In order to reuse ready-made circuit modules, the documents to which the designer has traditionally referred are only the manual about one circuit module and the hardware description of the circuit module. The manual has described the specification of the circuit module, that is, the function and the operation of the circuit module explained with reference to the timing charts or the like. The manual, however, merely illustrates the operations described on the charts and one example of behavior of an interface appearing in using a certain function. It does not exhaustively describe all the operations of the circuit module. Further, since the operation is represented only on the chart, in order to verify the feasibility to connect the circuit with the circuit module to be reused, the designer is required to verify if the waveform described on the chart is regenerated.

This verification has been done by the manual work, so that it needs lots of designing steps. Hence, if the designer misunderstand the timing chart, the proper circuit cannot be designed. To avoid this disadvantage, the designer has to correctly understand the manual and in some cases analyze the hardware description for grasping the operation.

According to an aspect of the invention, a computer readable medium is arranged to store a structure and an operation description of a conventional circuit module, distinguish a set of signal values to be taken on a specific time at each I/O terminal relevant to each function of the circuit module by means of identifiers for signals, and at a time store a description about an interface of each function of the hardware description with the combination of the identifiers on a temporal order.

According to another aspect of the invention, a verifying method is executed to verify if two circuit modules are to be connected by doing comparison of a slip of each time point on which a given event takes place between the two circuit modules by using the information stored in the computer readable medium.

According to another aspect of the invention, a method is executed to synthesize a signal pattern by following change of a signal appearing at the I/O terminal of the circuit module on the temporal order by using the information stored in the computer readable medium.

BRIEF DESCRIPTION OF THE DRAWINGS

FIG. 2 is an explanatory view showing a method of defining an interface specification according to an embodiment of the invention;

FIG. 3 is an explanatory table showing a data structure recorded on a computer readable medium in FIG. 2;

DESCRIPTION OF EMBODIMENTS

Figure 1:
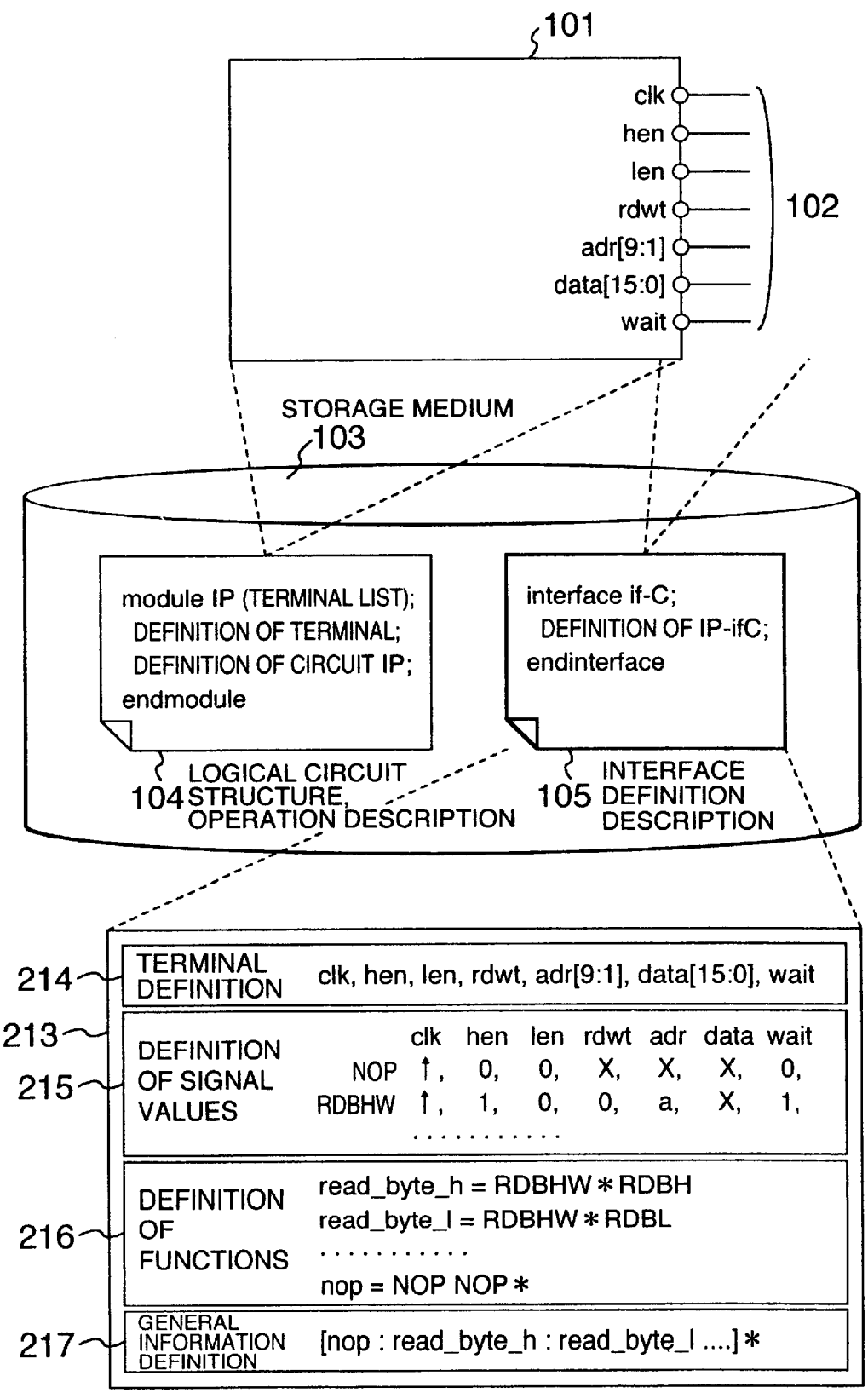
FIG. 1 is an explanatory view showing a summary of the invention.

FIG. 1 is a view for describing the summary of the invention in which the interface specification definition of the circuit module is stored on a storage medium. In FIG. 1, consider a logical circuit 101 provided with an I/O signal 102. Typically, the structure or the operation of this logical circuit is described using a hardware description language. The described data (104) is stored in a computer readable medium and then is used as save or design data. Or, the electronic storage medium itself may be sold as a commercial good. In FIG. 1, the interface definition description 213 shown in FIG. 2 is stored as data (105) on the computer readable medium 103 together with the data containing the description of the structure or the operation of the logical circuit.

FIG. 2 is a view for describing the detail of the interface definition description as shown in FIG. 1. In FIG. 2, a logical circuit 201 includes a plurality of I/O signals and functions (for example, 204 to 210) as indicated by 203. Concretely, these functions may be used as signal sequences as indicated by 211.

The function 203 of the logical circuit 201 is represented as the information indicated by 213. At first, the information 213 includes definition information 214 about the I/O signal interface 202 contained in the logical circuit 201. This definition information represents a bit width and a distinction of input and output of each terminal, for example. Then, the information further includes a definition 215 of signal values. The definition includes sets of possible values of those signals to which symbols are added respectively. In a synchronous logical circuit, as shown by 211, the other signals are changed according to one period of a clock signal clk. Then, a symbol may be defined to the set of the signals of one period. For example, a symbol RDBHW is defined to the combination of the signals indicated by 212. The information 213 includes definition for functions 216 as the next definition. The definition of functions is defined by the sequence of the symbols that are defined to the signal sequence about each of the functions 204 to 210 provided in the logical circuit 201. For example, the signal sequence indicated by 211 is represented as the sequence "NOP, NOP, RDBHW, RDBHW, RDBHW, RDBH, NOP". In actual, if two or more signal sequences may be provided for one function, one function is defined as a set of symbol sequences. For this signal sequence, a generic name of the function is defined. The signal sequence for representing the function is a sequence of all possible signal sequences as the operation of the function. For example, in a case that no shortage takes place if the first NOP and the last NOP of the sequence indicated by 211 exist, the function indicated by 211 is defined as "RDBHW, RDBHW, RDBHW, RDBH". The last definition is general information definition 217. This definition corresponds to a definition of mutual relation between the definitions of functions defined by 216. For example, when the logical circuit 201 is started, the function to be necessarily done at first and the function that cannot be continuously used are defined by using the names defined by the definition of functions.

The definitions 214 to 217, that is, the information about terminal definition, the definition of signal values, the definition of functions, and the general information definition represent the corresponding relation between the functions of the logical circuit and the signal sequence of the I/O interface signal corresponding to the function. This representation is called interface definition description.

FIG. 3 is an explanatory view showing the data structure of an interface definition description data 213 in a computer readable storage medium.

At first, the name 301 of the interface to be described is stored. Next, the data for representing three types of definitions including a terminal name, a signal width (number of signal lines) and a signal attribute of input or output about each of the terminals provided in the interface is stored as a combination. The number of the combination data is equal to the number of the terminals. At last, the data for representing the terminal symbol is stored. Next, the data 303 for representing the definition of signal values is provided. In the data 303, the set of possible logical values (0, 1, uncertain, or the like) to be taken by the terminal that is described in 302 and the identifiers for the set are represented as a combination. In the example shown in FIG. 3, two identifiers may be provided, that is, "identifiers of signal values" and "clipped names". The identifier of the signal value is represented by the meaningful word and the range of such words and the clipped name is made up of a short number of characters, for example, one or two characters. The same number of the logical values as the number of the terminal names described by 302 are listed. The definitions of signal values have the terminal symbols at the tail when they are stored.

Next, the definition of function 304 is represented by the identifier of the function, the identifiers of signal values composed by storing the corresponding signal sequence to the function in 303, or the clipped names. Further, the symbols for representing the repetition of the definition of the signal values or the selection of the identifiers are stored as well. Those data items are stored in "signal, signal name". The signal name used herein employs the following symbols.

(1) "*" is a symbol that signifies 0 or more to infinite repetitions of identifiers of signal values. For example, if "A B*C" is stored, "A C, ABC, ABBC, ABBBC" may be represented.

(2) "(" or ")" is a symbol that treats a sequence of definitions of signal values laid between "(" and ")" at a batch like the mathematical expression. For example, if "A(B C)*" is stored, it represents "A, A B C, A B C B C".

(3) "<" or ">" is a symbol that represents the case that a sequence of definition of signal values laid between "<" and ">" exists or the case that no sequence exists. For example, if "A<B>C" is stored, it represents "A C, A B C".

(4) "[", "|" or "]": Of the sequences of the definitions of signal values laid between "[" and "]", either one of the sequences delimited by "|" is represented by those symbols. For example, if "A [B | C] D" is stored, it represents "A B D, A C D".

The defined function exactly represents the change of an interface signal about the functions of the subject logical circuit such as "reading data" and "writing data". Since the defined signal sequence has a corresponding length to each function, the last item of the definition stores the terminal symbol.

The last item 305 means the general information definition. The possible sequences of the functions defined in 304 are represented by using the definition for functions defined in 304 and the same symbols as those used in 305 and then are stored. Since the data is also a variable-length data, the terminal symbol is stored in the tail of the data. The general information definition is stored as "A [B | C] *" if the function A to be executed once at the power-up of the circuit and the other functions B and C exist. If any limitation for execution exists between the functions A and B or if the function A is inevitably followed by the function C, then followed by the function B, the sequence of "A C B" is stored.

The following operations can be easily realized from the data structure stored in the computer readable medium and the data itself.

(1) Any signal sequence to be taken by the signal composing the interface represented by the data structure may be generated. This makes it possible to make sure that a test pattern appearing in executing the logical simulation by using the computer or the result of the logical simulation is correct and make sure that any function is regenerated when the logical simulation is executed on any test pattern. Later, the embodiment for realizing this will be described with reference to FIG. 10.

(2) It is determined if the connection circuit for connecting two logical circuits may be realized from this data structure. The embodiment for realizing this will be described with reference to FIG. 4.

(3) This data structure makes it possible to automatically generate the connection circuit for connecting two logical circuits with each other.

Figure 11:
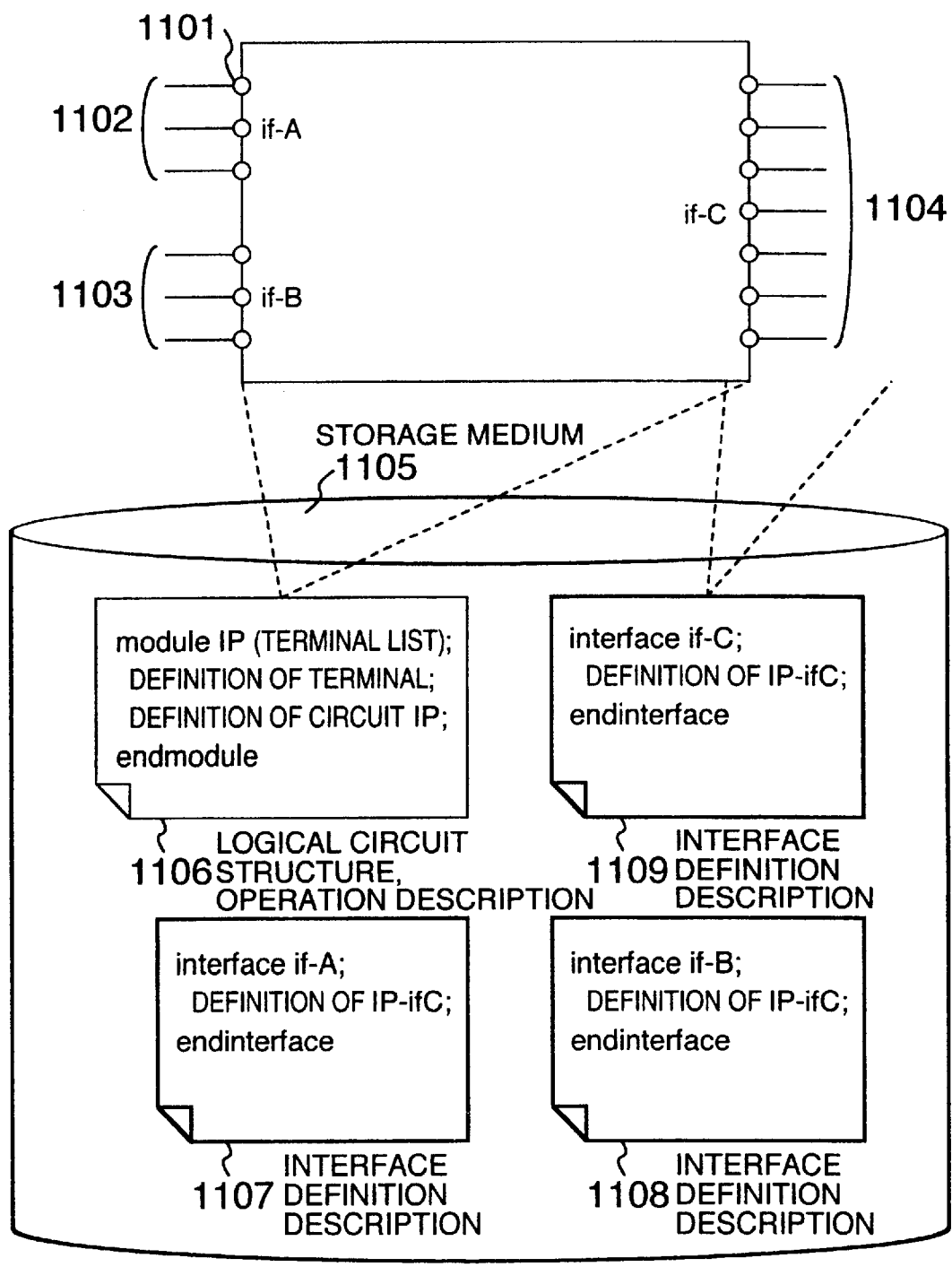
FIG. 11 is a view showing another embodiment of the invention in which the logical circuit provides plural interface definition descriptions.

FIG. 11 is an explanatory view showing the second embodiment of the present invention. In this embodiment, a logical circuit 1101 includes I/O interface groups (1102 to 1104). In correspondence with each I/O interface group, the computer readable medium 1105 stores a logical circuit structure, an operation description 1106 and an interface definition descriptions 1107 to 1109, each of which corresponds to each I/O interface group.

Figure 12:
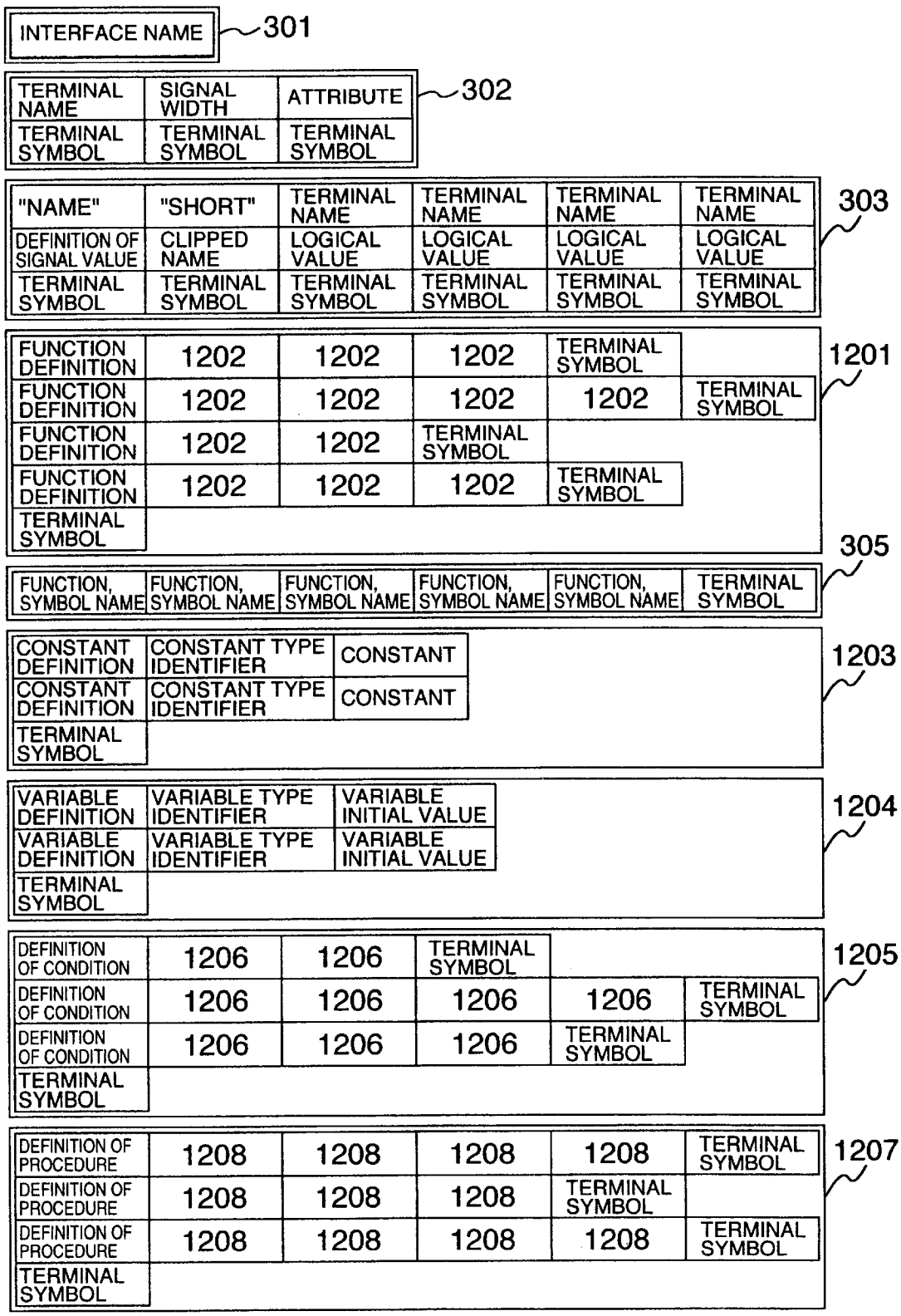
FIG. 12 is a table showing an expansion of the data structure shown in FIG. 3.

The expanded data structure will be described with reference to FIG. 12. FIG. 12 is an expansion of the data structure shown in FIG. 3. In FIG. 12, 301 to 303 and 305 have the same structure as the data structure shown in FIG. 3.

1201 denotes a definition of expanded functions. It has the same structure as that of 304 except that the data component 1202 stores a signal name, a condition name, and a procedure name.

1203 denotes a definition of constants. It consists of a constant definition name, a constant type identifier and a constant. The constant type identifier belongs to an I type for representing an integer or a T type for representing a time.

1204 denotes a definition of variables. It consists of a variable definition name, a variable type identifier, and a variable initial value. This variable type identifier is the same as the constant type identifier.

1205 denotes a definition of conditions. It consists of a definition of conditions, a variable name, a constant name, an operational symbol name or a component 1206 composed of an operational name, and a terminal symbol.

1207 denotes a definition of procedures. It consists of a procedure definition name, a variable name, a constant name, an operation symbol name or a component 1208 composed of an operation name, and a terminal symbol.

For example, the expanded data structure has:
as a constant definition
a constant name of UPPER, a type of I and a constant value of 3,
as a variable definition
a variable name of cnt, a type of I and an initial value of 0,
as a definition for functions
a function identifier of X, 1202 of A (pBt)*, and "terminal symbol", wherein X denotes a definition for functions, A and B denote signal names, p denotes an identifier of a condition, and t denotes an identifier of a procedure.
as a definition of conditions
an identifier of a certain condition of p, 1206 of cnt=cnt+1, and "terminal symbol", in which the data structure stored as above represents as the function X a signal sequence having only three Bs after A, that is, "A, AB, ABB, ABBB",
as another example,
as definition of variables,
an identifier for variables of tx, a type of T and an initial value of 0,
as a definition for functions,
an identifier for dunctions of Y, 1202 of A t2 and B*p2,
as a definition of conditions,
an identifier of conditions of ps and 1206 of (now−tx) <100 ms
as a definition of procedures,
a procedure identifier of t2 and 1208 of tx=now, in which the data structure stored as above signifies a signal sequence consisting of a repetition of B within an interval of 100 ms after A as the function Y, "now" denotes the current time and "ms" denotes a time unit.

Figure 4:
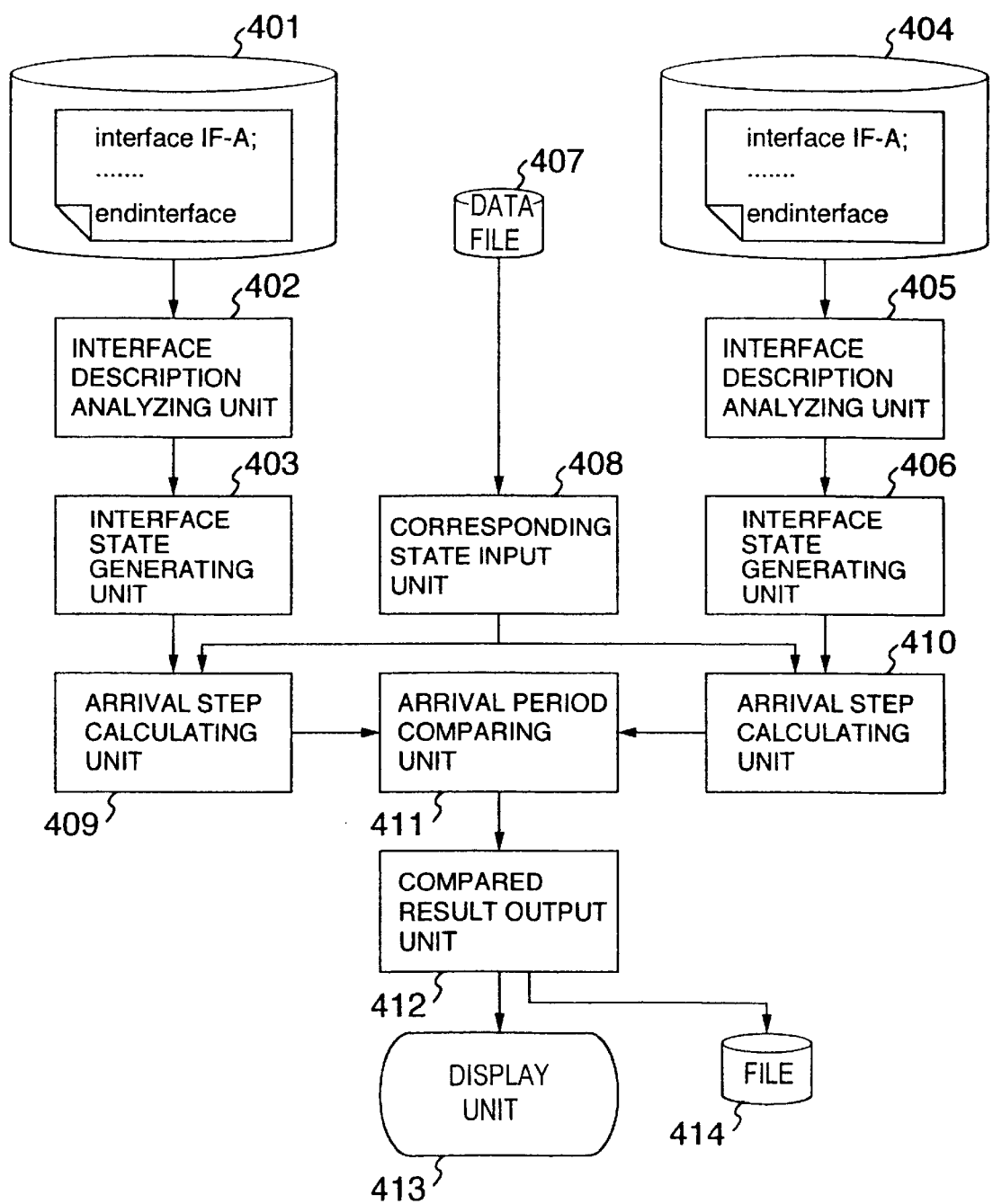
FIG. 4 is a block diagram showing a system for determining feasibility to connect two logical circuits by using an interface definition description.
Figure 5:
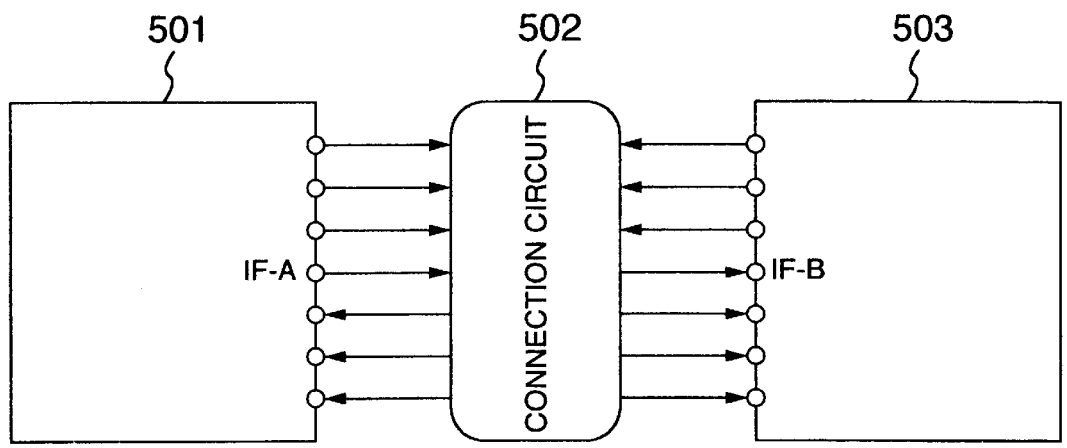
FIG. 5 is a diagram showing a connection circuit for connecting two logical circuits with each other to which the present invention may apply.

FIG. 4 is a block diagram showing a system for determining if two logical circuits are to be connected by using the interface definition description according to the present invention. This system is inputted with the interface definition descriptions IF-A (401) and IF-B (404) of the two logical circuits to be connected. Further, the system is also inputted with a data file 407 in which how the functions defined in the interface definition descriptions correspond to each other is described. Then, the system serves to determine if the logical circuit for connecting two interfaces with each other may be composed from the inputted data. As shown in FIG. 5, the logical circuit for connecting the interfaces with each other indicates a circuit such as a connection circuit 502 for connecting a logical circuit 501 having an interface IF-A with a logical circuit 503 having an interface IF-B.

Before describing the system shown in FIG. 4, the description will be oriented to the method for calculating an arrival step of the data obtained by analyzing the interface definition description with reference to FIGS. 6 to 9. The arrival step of the data indicates a value for representing which of the cycles after the start of the process the effective data is transmitted or received with regard to a certain function of the interface.

Figure 6:
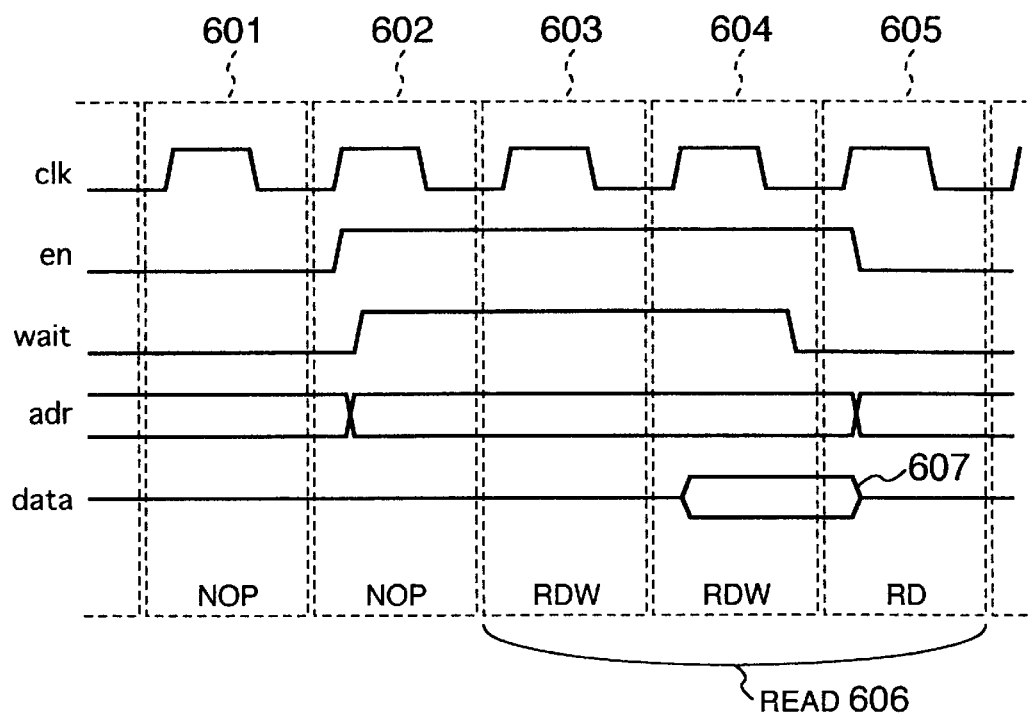
FIG. 6 is a chart showing an example of signal sequences of one function in an interface.

FIG. 6 is a timing chart showing one function of a certain interface. The signal in this interface is synchronous to the rise of a clock signal clk. Two cycles 601 and 602 are null and contains a definition of a signal value called NOP. The function 606 called READ starts from 603 and terminates at 605. In the start cycle 603, an enable signal en, a wait signal wait, and an address value adr are asserted. In the cycle 605, the wait signal wait is negated, so that the effective data 607 on the data line data appears. The state (603, 604) that the enable signal en is asserted and the wait signal wait is also asserted is assumed as the definition name of the signal value called RDW. The state 605 that the wait signal wait is negated and the effective data on the data line data appears is assumed as the definition name of the signal value called RD. The function READ may be represented as the sequence of the definition names of signal values called "RDW RDW RD".

Figure 7:
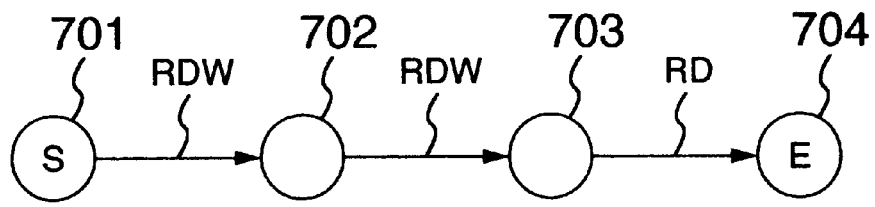
FIG. 7 is a view showing an example of FIG. 6 through a state transition graph.
Figure 8:
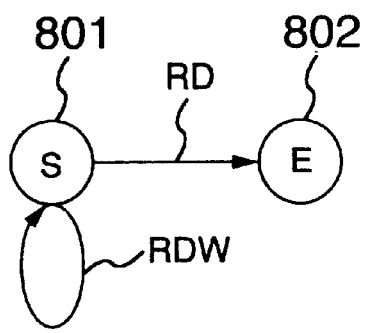
FIG. 8 is an explanatory view showing an example of a state transition graph.

When the sequence of the identifiers of signal values is represented by a state transition graph, the graph is made to be the view shown in FIG. 7. This state transition graph has a start point S (701) and an end point E (704) and the arcs of the graph correspond to the identifiers of signal values. The example "RDW RDW RD" is represented so that the first RDW is a transition arc from 701 to 702, the second RDW is a transition arc from 702 to 703, and the last RD is a transition arc from 703 to 704. In this example, the effective data (607 in FIG. 6) appears at the third cycle, so that the arrival step is 3.

However, if the actual circuit has a specification that the state of RDW is repeated as long as the wait signal wait is asserted, the actual operation is considered from the case of only "RD" where no wait signal wait is asserted to the case of infinitely continuing RDW. In such a case, it is impossible to enumerate all the cases. Hence, this operation is represented by using a repetition symbol "*". Concretely, by describing the operation as "RDW*RD", it is possible to represent a signal sequence that RD follows the continuous sequence of 0 or more RDWs. By representing this example by the state transition graph, the resulting view is made to be the graph shown in FIG. 8. Two transition arcs RDW and RD come out of the start point S (801). Since the RDW returns to the start point S again, 0 or more or infinite repetitions of RDW are represented. The arrival step in this case ranges from 1 to infinity, which may be represented as the interval [0, ∞].

Figure 9:
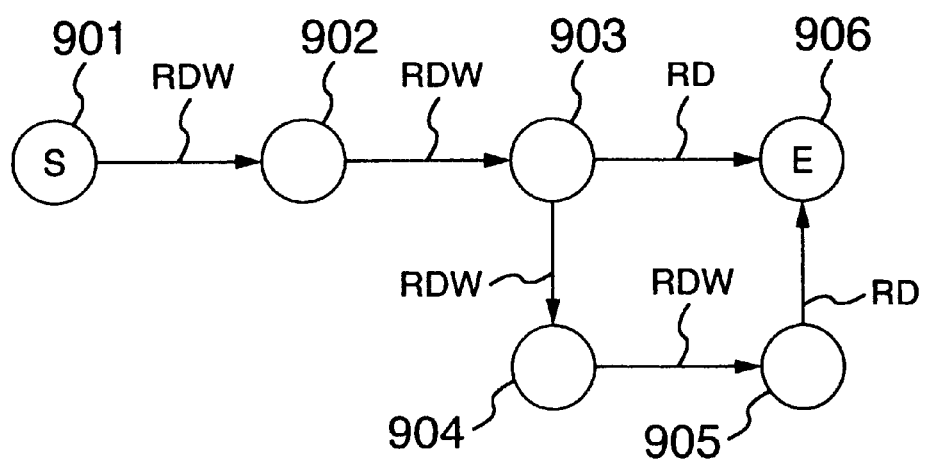
FIG. 9 is an explanatory view showing another example of a state transition graph.

The state transition shown in FIG. 9 represents that RD appears at the third or the fifth cycle. The sequence of the identifiers of signal values in this case may be described as "(RDW RDW RD)|(RDW RDW RDW RDW RD)" by using the OR symbol "|" or represented as "RDW RDW<RDW RDW? RD" by using the symbol "<>" for indicating the presence or the absence. The arrival step in this case may be represented as a set called (3, 5).

As described above, by creating the state transition graph from the sequence of the identifiers of signal values and calculating the number of arcs from the start point to a specific arc on the graph, it is possible to calculate the value of the arrival step. Based on this principle, the operation of the system for verifying the feasibility to connect two circuits of FIG. 4 will be described.

In FIG. 4, 401 and 404 denote a file for storing an interface definition description for a logical circuit to be connected. At 402 and 405, these files are read. At 403 and 406, the state transition graph is created. At 409 and 410, each arrival step is calculated. In connecting two logical circuits before calculating the arrival step, an operation is executed to input a data file 407 in which the corresponding relation between the functions (for example, one function for outputting the data and the other function for inputting the data) is described. Then, the portions where the effective data appears about the function to be analyzed and the corresponding function are indicated to both of the arrival step calculating unit 409 and 410. The calculated arrival steps are compared in the comparing unit 411 of the arrival periods. The compared result is outputted from an output unit 412 of the compared result to a display unit 413 or a file 414.

In the corresponding relation of the functions specified by the file 407 of the logical circuit to be connected, as a premise of comparison, the transfer of the data in which one is for output and the other is for input is established.

The comparison in the comparing unit 411 of the arrival periods is divided into two stages. At the first stage, it is checked if the ranges of both of the arrival steps are overlapped with each other. If overlapped, the data may be transferred on the same timing. If not overlapped, the operation goes to the second stage. At the second stage, it is checked if the range on the data input side is larger than the range on the data output side, that is, the former is later than the latter. If the former is later than the latter, a circuit for temporarily holding data such as latch in a connection circuit is provided for correctly transferring the data. By doing the above comparison, it is determined if the proper connection is made possible. The output unit 412 of the compared result serves to output whether or not the ranges are overlapped at the first stage and whether or not the condition is met at the second stage to a display unit 413 or a file 414. If overlapped at the first stage, this result indicates that the connection circuit can be realized without having to provide a data buffer. If the condition is met at the second stage, it indicates that the connection circuit that needs a data buffer can be realized. If the condition is not met at the second stage, it indicates that the connection circuit cannot be realized.

By using the system for verifying the feasibility to connect the two circuits as shown in FIG. 4, it is possible to verify if the connection circuit can be realized before designing the connection circuit between any of the logical circuits.

Figure 10:
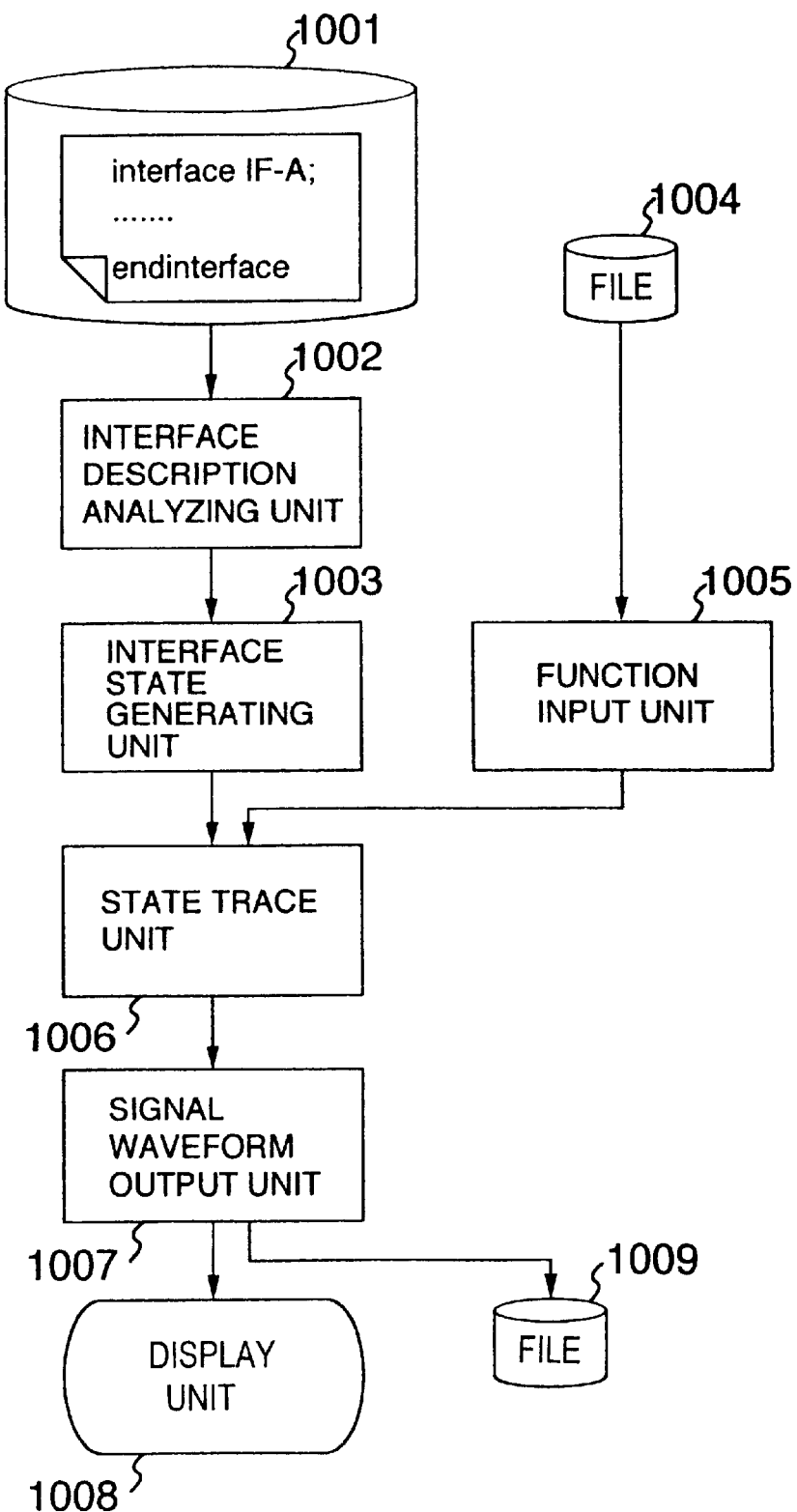
FIG. 10 is a block diagram showing a system for generating a signal pattern for simulation to be given to an interface based on an interface definition description.

FIG. 10 is a block diagram showing a system for automatically generating a signal pattern for simulation to be given to an interface, based on the definition description of the interface. Like the process of determining the feasibility, the process is executed to generate a state transition graph from the definition description of the interface. The file 1001 for saving the definition description of the interface is read by an interface description analyzing unit 1002. Then, the state transition graph is generated by the interface state generating unit 1003. In generating the simulation pattern, a file 1004, in which the function of the interface whose pattern is to be generated, is described by a function input unit 1005. A state trace unit 1006 operates to trace the state transition graph for the specified function so as to numerate the identifiers of signal values on a passage from a start point (for example, 701 shown in FIG. 7) to an end point (for example, 704 shown in FIG. 7) in sequence. Based on the numerated sequence, a signal waveform output unit 1007 operates to output to a display unit 1008 or a file 1009 the corresponding waveforms to the identifiers of signal values with a logical value of each terminal in the definition of signal values as a simulation pattern.

The foregoing process makes it possible to arrange the system for generating a signal pattern for simulation from an interface definition description.

The foregoing embodiments of the present invention makes it possible to describe the interface operation of the read-made logical circuit block using the present invention and store the description in a computer readable storage medium. Further, they make it possible to distribute the stored data in combination with the hardware description of the logical circuit block, generate a signal sequence on a terminal for composing the interface from the data, display the signal sequence, or utilize it as a test pattern for a logical simulation. Moreover, by using the interface description of the two logical circuits to be connected, it is possible to verify if the two logical circuits are to be connected, which leads to reducing the conventionally problematic verifying work done by a designer that has been conventionally required in using the ready-made circuits.

What is claimed is:

1. A computer readable medium including as storage data:
   a hardware description having a description of a function of a circuit module; and
   an interface description provided by distinguishing sets of signal values, each output terminal takes on plural time points at each pattern and adding an identifier to each of said sets for defining said set and representing said function of said hardware description with the set of said identifiers in a temporal order,
   wherein said interface description comprises definition of conditions and definition of procedures to represent the signal sequences obtained through a repetition of said identifiers or sets of said identifiers in a range of meeting said conditions.

2. The computer readable medium according to claim 1, wherein said interface description further comprises an interface specification definition of a function of the circuit module, and wherein said interface specification definition is described by a sequence of first symbols and second symbols, each of said first symbols being defined to a set of signal values of terminals of the circuit module and each of said second symbols representing an occurrence of said set of signal values.

3. The computer readable medium according to claim 2, wherein at least one of the second symbols include a symbol which represents 0 to infinite repetitions of the set of signal values defined by the first symbol.

4. The computer readable medium according to claim 2, wherein at least one of the second symbols include a symbol which represents plural sets of signal values defined by plural first symbols being treated as one set.

5. The computer readable medium according to claim 2, wherein at least one of the second symbols include a symbol which represents the set of signal values defined by the first symbol occurring or not occurring.

6. The computer readable medium according to claim wherein at least one of the second symbols include a symbol which represents one of plural sets of signal values defined by plural first symbols occurring.

7. The computer readable medium according to claim 1, wherein said hardware description describes a structure or an operation of the circuit module.

8. The computer readable medium according to claim 1, wherein said interface description further comprises definitions of terminals, each of definitions of terminals including a bit width and a distinction of input or output.

9. The computer readable medium according to claim 1, wherein said interface description further comprises a definition of mutual relation between a plurality of the functions, which describes a sequence of a plurality of the definitions of functions in a possible temporal order.

10. A computer readable medium including as storage data:

a hardware description having a description of a function of a circuit module; and an interface description provided by distinguishing sets of signal values, each output terminal takes on plural time points at each pattern and adding an identifier to each of said sets for defining said set and representing said function of said hardware description with the set of said identifiers in a temporal order, wherein said interface description represents said function of said hardware description by ranging said identifiers at periods of a clock signal in a temporal order.

11. The computer readable medium according to claim 10, wherein said interface description comprises definition of conditions and definitions of procedures to represent the signal sequences obtained through a repetition of said identifiers or sets of said identifiers in a range of meeting said conditions.

12. A connection verifying method utilizing an electric data of circuit modules stored in a computer readable medium including as storage data:

a hardware description having a description of a functions of a first and a second circuit module; and an interface description provided by distinguishing sets of signal values, each output terminal takes on plural time points at each pattern and adding an identifier to each of said sets for defining said set and representing said function of said hardware description with the set of said identifiers in a temporal order, said connection verifying method comprising the steps of:

checking corresponding relation of a function between the first and the second circuit modules, based on said hardware description and said interface description included in said electric data;

obtaining arrival steps of both the first and the second circuit modules by combining said identifiers for representing the corresponding functions of said first and second circuit modules on the temporal order, based on said hardware description and said interface description included in said electric data; and determining if the connection of both the first and the second circuit modules is made possible on the presence or the absence of the overlap of the ranges of said arrival steps of both the first and the second circuit modules, based on aid hardware description and said interface description included in said electric data.

13. The connection verifying method according to claim wherein said interface description further includes an interface specification definition of a function of the circuit module, and wherein said interface specification definition of the function is described by a sequence of first symbols and second symbols, each of said first symbols being defined to a set of signal values of terminals of the circuit module and each of said second symbols representing an occurrence of the set of signal values.

14. The connection verifying method according to claim 13, wherein the second symbols includes a symbol which represents 0 to infinite repetitions of the set of signal values defined by the first symbol.

15. The connection verifying method according to claim 13, wherein at least one of the second symbols includes a symbol which represents plural sets of signal values defined by plural first symbols being treated as one set.

16. The connection verifying method according to claim 13, wherein at least one of the second symbols includes a symbol which represents the set of signal values defined by the first symbol occurring or not occurring.

17. The connection verifying method according to claim 13, wherein at least one of the second symbols includes a symbol which represents one of plural sets of signal values defined by plural first symbols occurring.

18. The connection verifying method according to claim 12, wherein said hardware description describes a structure or an operation of the circuit module.

19. The connection verifying method according to claim 12, wherein said interface description further includes definitions of terminals, each of definitions of terminals including a bit width and a distinction of input or output.

20. The connection verifying method according to claim 12, wherein said interface description further includes a definition of mutual relation between a plurality of the functions, describing as a sequence of a plurality of the definitions of functions in a possible temporal order.

* * * * *